(12) United States Patent
Allen

(10) Patent No.: US 6,222,468 B1
(45) Date of Patent: Apr. 24, 2001

(54) ADAPTIVE CODING WITH ADAPTIVE SPEED

(75) Inventor: James D. Allen, Uthai Thani (TH)

(73) Assignees: Ricoh Company, Ltd., Tokyo (JP); Ricoh Corporation, West Caldwell, NJ (US)

(*) Notice: Subject to any disclaimer, the term of this patent is extended or adjusted under 35 U.S.C. 154(b) by 0 days.

(21) Appl. No.: 09/090,452

(22) Filed: Jun. 4, 1998

(51) Int. Cl.[7] .................................................. H03M 7/00
(52) U.S. Cl. ............................................ 341/107; 341/61
(58) Field of Search ................................ 341/51, 107, 61, 341/95, 50, 60; 382/233, 247; 702/181

(56) References Cited

U.S. PATENT DOCUMENTS

| | | |
|---|---|---|
| 4,633,490 | 12/1986 | Goertzel et al. . |
| 4,935,882 * | 6/1990 | Pennebaker et al. ................. 702/181 |
| 5,381,145 * | 1/1995 | Allen et al. ........................... 341/107 |
| 5,471,206 | 11/1995 | Allen et al. . |
| 5,583,500 | 12/1996 | Allen et al. . |
| 5,710,562 * | 1/1998 | Gormish et al. ..................... 341/107 |

FOREIGN PATENT DOCUMENTS 2 306 280   4/1997   (GB) .

OTHER PUBLICATIONS

Bottou et al, "The Z–Coder Adaptive Binary Coder," IEEE, entire document, 1998.*

Bottou, Leon et al., "The Z–Coder Adaptive Binary Coder", IEEE *Data Compression Conference*, Mar. 30, 1998–Apr. 01, 1998, pp. 13–22.

* cited by examiner

*Primary Examiner*—Patrick Wamsley
(74) *Attorney, Agent, or Firm*—Blakely, Sokoloff, Taylor & Zafman LLP

(57) ABSTRACT

Adaptive coding method and apparatus in which the speed at which the coder transitions between different codes to perform bit generation is adapted, or adjusted, while coding the data to arrive at a point where the initial bits of the outputs include zeros and ones occurring equally often.

25 Claims, 6 Drawing Sheets

ADAPTIVE CODING WITH ADAPTIVE SPEED

FIELD OF THE INVENTION

The present invention relates to the field of data compression and decompression; more particularly, the present invention relates to coding that adapts the speed by which a coder transitions between different codes to generate bits.

BACKGROUND OF THE INVENTION

Data compression is a useful tool for storing and transmitting large amounts of data. For example, the time required to transmit an image, such as a facsimile transmission of a document, is reduced when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

Golomb coding is a lossless coding technique. In Golomb coding, Less Probable Symbols (LPSs) are represented by a '0' followed by the number of preceding More Probable Symbols (MPSs) in binary. MPS's are grouped together and represented by a '1.' The number of MPS's together that are represented by a "1" varies between the different Golomb codes, which are identified by a Golomb parameter, and is related to the probability of an LPS. This is an optimal entropy coding of Bernoulli (or other stationary) source data.

Since optimal entropy codes are incompressible, it follows that the '0's and '1's in the Golomb code output should occur equally often. The initial bit in the Golomb output (referred to herein as the "Stone-age symbol") maps an LPS to '0' and maps an MPS to '1' so an excess of 0's indicates that the LPS is more probable than expected, and vice versa.

Adapting between different codes has been taught in the prior art. An example may be shown in U.S. Pat. No. 5,381,145, entitled "Method and Apparatus for Parallel Decoding and Encoding of Data" (Allen et al.), issued Jan. 10, 1995, and assigned to the corporate assignee of the present invention. Allen discloses a probability estimation table and bit stream generator for an R coder. An R coder uses R codes to code data. R codes are adaptive codes which include Golomb runlength codes. The probability estimation state table includes a state counter and a code associated with each of the separate states in the table. The coder is initially in state zero and after each codeword is processed, the state counter is incremented or decremented depending on the first bit of the codeword. A codeword of zero increases the magnitude of the state counter, while a codeword starting with 1 decreases the magnitude of the state counter. Therefore, every codeword causes a change to be made by the state counter.

Generally, one of the disadvantages of this arrangement is that the speed with which the Golomb parameter ramps is fixed, although alternative embodiments would allow the speed to be downloaded based on experience with training sets. This is disadvantageous in that the data may not allow the coder to use a more optimal code sooner in the coding process, thus resulting in less or worse compression. Also, the optimal speed may vary often over time, particularly due to differences in the information being coded (e.g., color facsimile statistics will be different than text portraits and backgrounds).

Allen does state that the coder may start in one of the states, and the increments and decrements do not have to be made according to a fixed number. Instead, the probability estimate can be incremented by a variable number according to the amount of data already encountered or the amount of change in the data (stability). However, the speed at which the coder switches between using different codes is not made based on whether use of the entropy codes is optimal.

The present invention provides for adaptive coding with adaptive speed that is neither fixed nor downloaded, but rather is set adaptively and is made based on whether use of the entropy codes is optimal. This adaptive quality may allow for retuning in real time to new optimal speeds for a variety of data types.

SUMMARY OF THE INVENTION

A method and apparatus for coding and decoding data is described. In one embodiment, the present invention comprises a method and apparatus for monitoring an initial output bit of each multiple outputs generated by a coder in response to at least a portion of the data and a method and apparatus for adjusting the speed at which the coder transitions between different codes, used by the coder to code inputs into outputs, based on the initial output bits of the multiple outputs.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1:
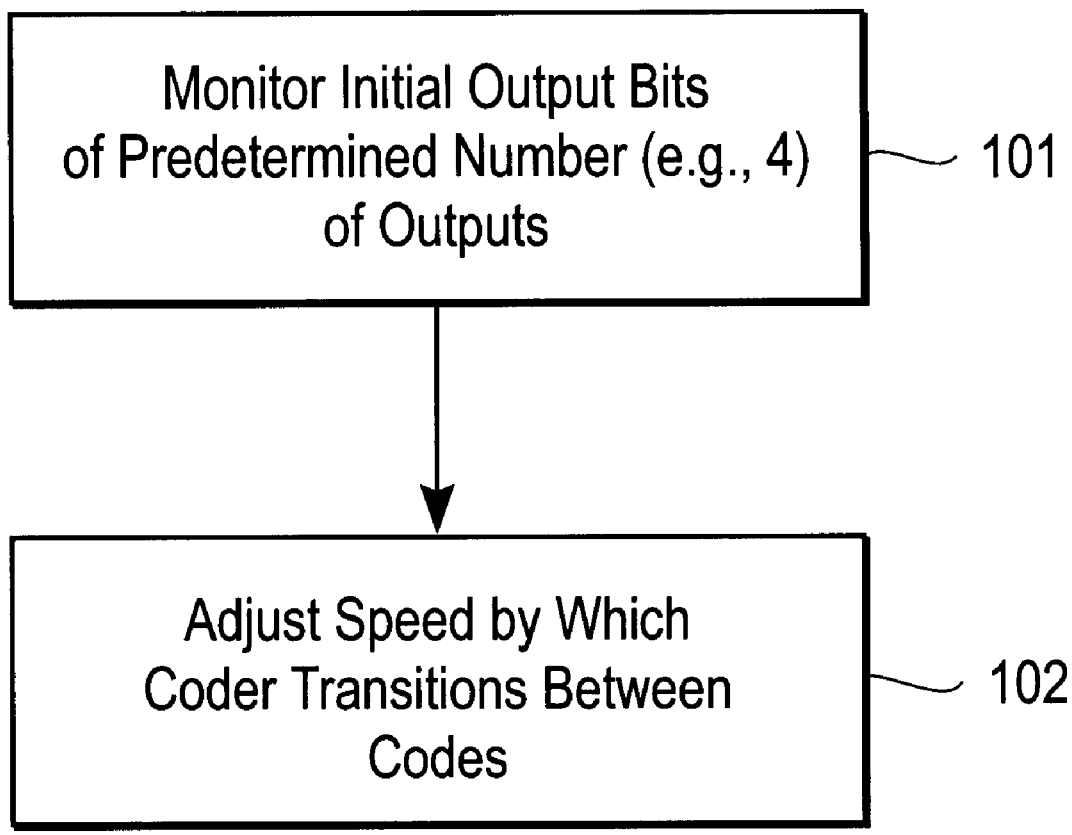
FIG. 1 is a flow diagram of an encoding process.

A method and apparatus for coding with adaptive speed in transitioning between different codes in a coder is described. In the following description, numerous details are set forth, such as numbers of bits, types of components, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but not limited to, any type of disk including floppy disks, optical disks, CD-ROMs, and magneto-optical disks, read-only memories (ROMs), random access memories (RAMs), EPROMs, EEPROMs, magnetic or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

Overview of the Present Invention

The present invention provides adaptive coding in which a coder dynamically switches between the use of different codes to perform bit generation and the speed at which the coder switches been codes is adaptive (i.e., changes dynamically). The goal of using this adaptive approach is to achieve improved compression. In one embodiment, the coder employs an adaptive Golomb coding with adaptive speed, such that the Golomb parameter adjusts dynamically and at a dynamic rate of change in an attempt to make the initial output bits (i.e., the stone-age symbol) of the outputs of the coder more nearly compressible. The adjustment operates to retune the speed at which the coder transitions between different codes, used by the coder to code inputs into outputs, in real time to a speed closer to optimal.

FIG. 1 illustrates a general overview of a diagram depicting the present invention. The present invention may be performed by processing logic which may be software that is run on a general purpose computer system or dedicated machine, hardware, or a combination of both. Referring to FIG. 1, processing logic monitors initial output bits of a predetermined number of outputs (processing block 101). The initial output bits are referred to herein as the stone-age symbols and result as part of the output generated by a coder. The entropy coded stream is fed back for monitoring. The coder switches between different codes when comparing data in order to obtain better compression.

In one embodiment, the predetermined number of outputs is 4, although any number may be continuously (or non-continuously) monitored. Then, the processing logic adjusts the speed by which the coder transitions between codes to code the input data to the coder based on the state of the initial output bits of the predetermined number of outputs (processing block 102). Thus, when performing coding, second-order statistics of the entropy coded stream are used to adjust the speed by which the coder transactions between codes. This allows for retuning to new optimal speeds, which may vary over time due to, for example, data types (e.g., color FAX, text portraits, background).

Note that more than one coder may be included and transitioning.

In one embodiment, the adaption heuristic that determines the speed of adaptation is based on the insight that the output code should be incompressible. For instance, code patterns of multiple stone-age symbols being '0101' or '1010' suggest that adaption speed is too quick. In such a case, the speed is then lowered so that these patterns occur just as often as '0000' and '1111.'

In one embodiment, Golomb codes are used by the coder to generate the outputs. An example of a G(6) Golomb code is as follows:

TABLE 1

| G(6) Golomb Code | | |
|---|---|---|
| L | → | 0 00 |
| ML | → | 0 01 |
| MML | → | 0 100 |
| $M^3L$ | → | 0 101 |
| $M^4L$ | → | 0 110 |
| $M^5L$ | → | 0 111 |
| $M^6$ | → | 1 |

An example of a G(8) Golomb code is as follows:

TABLE 2

| G(8) Golomb Code | | |
|---|---|---|
| L | → | 0 000 |
| ML | → | 0 001 |
| MML | → | 0 100 |
| . | | |
| . | | |
| . | | |
| $M^7L$ | → | 0 111 |
| $M^8$ | → | 1 |

Note that in both Tables 1 and 2, the first bit to the right of the arrow indicates the stone-age symbol. Golomb codes are well-known in the art.

Figure 1A:
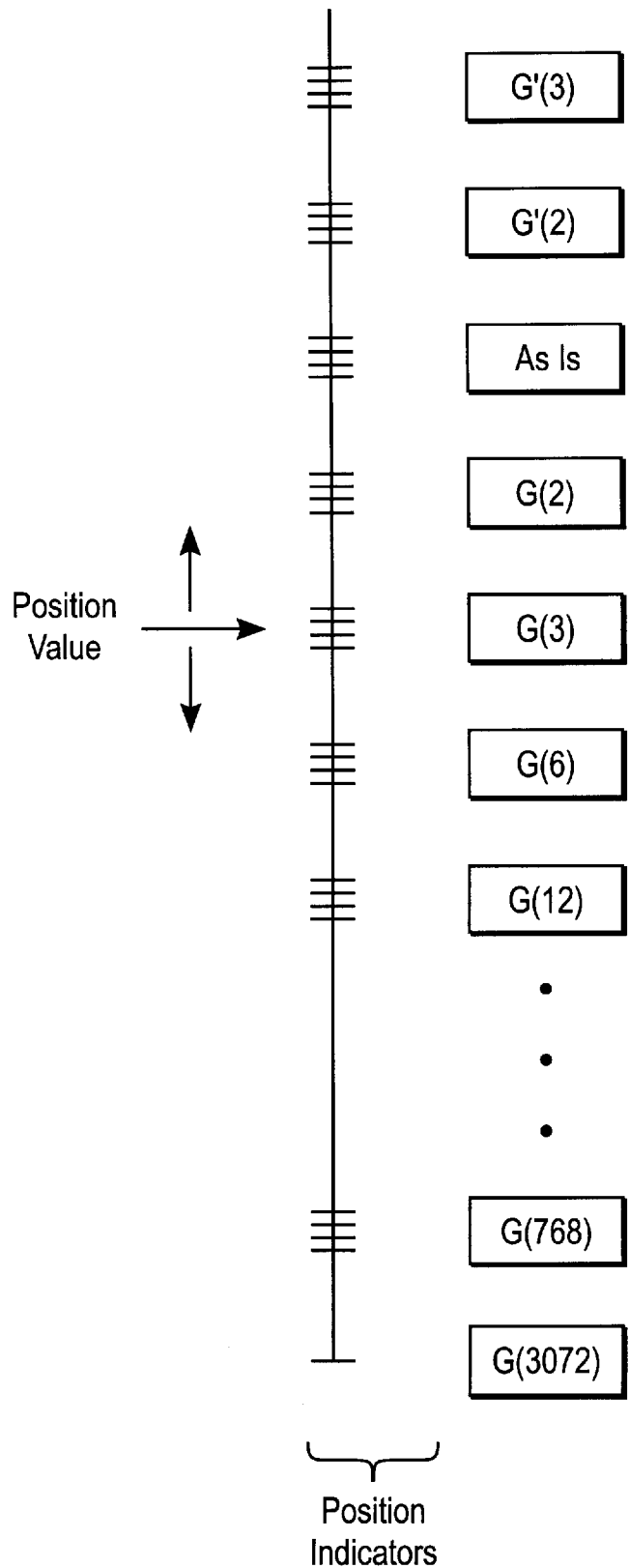
FIG. 1A is a series of Golomb codes placed in a table.

In one embodiment, a series of Golomb codes are placed in a table, such as shown in FIG. 1A. A number of position indicators are individually associated with one Golomb code to indicate that a particular code has been selected for use by the coder to generate bits. A position value specifies one of the position indicators to facilitate the selection of a code. As the position value is increased (e.g., incremented) or decreased (e.g., decremented), a new code may be chosen for use by the coder to generate outputs. Each code may have a number of position indicators so that any individual increase or decrease may not cause the coder to change codes. The amount of increase or decrease in the position value corresponds to the speed adaption of the present invention. An "As Is" code is included in the table and refers to a code which does not perform coding on the data and outputs the bit(s) as they are input.

Another implementation of the table in FIG. 1A may have included table entries, each with a code, such that a code may appear in a number of successive table entries.

Note that other codes may be used, such as the self-involutory code (e.g., L→00; ML→01; MM→1). However, the present invention exploits the special simplicity of the Golomb code and, thus, this code is preferred.

The adapted Golomb code of the present invention is optimal for Bernoulli source of unknown parameter (e.g., probability of an event) or any other stationary source. Furthermore, the present invention may be optimal for any non-stationary source of appropriate viscosity.

Figure 2:
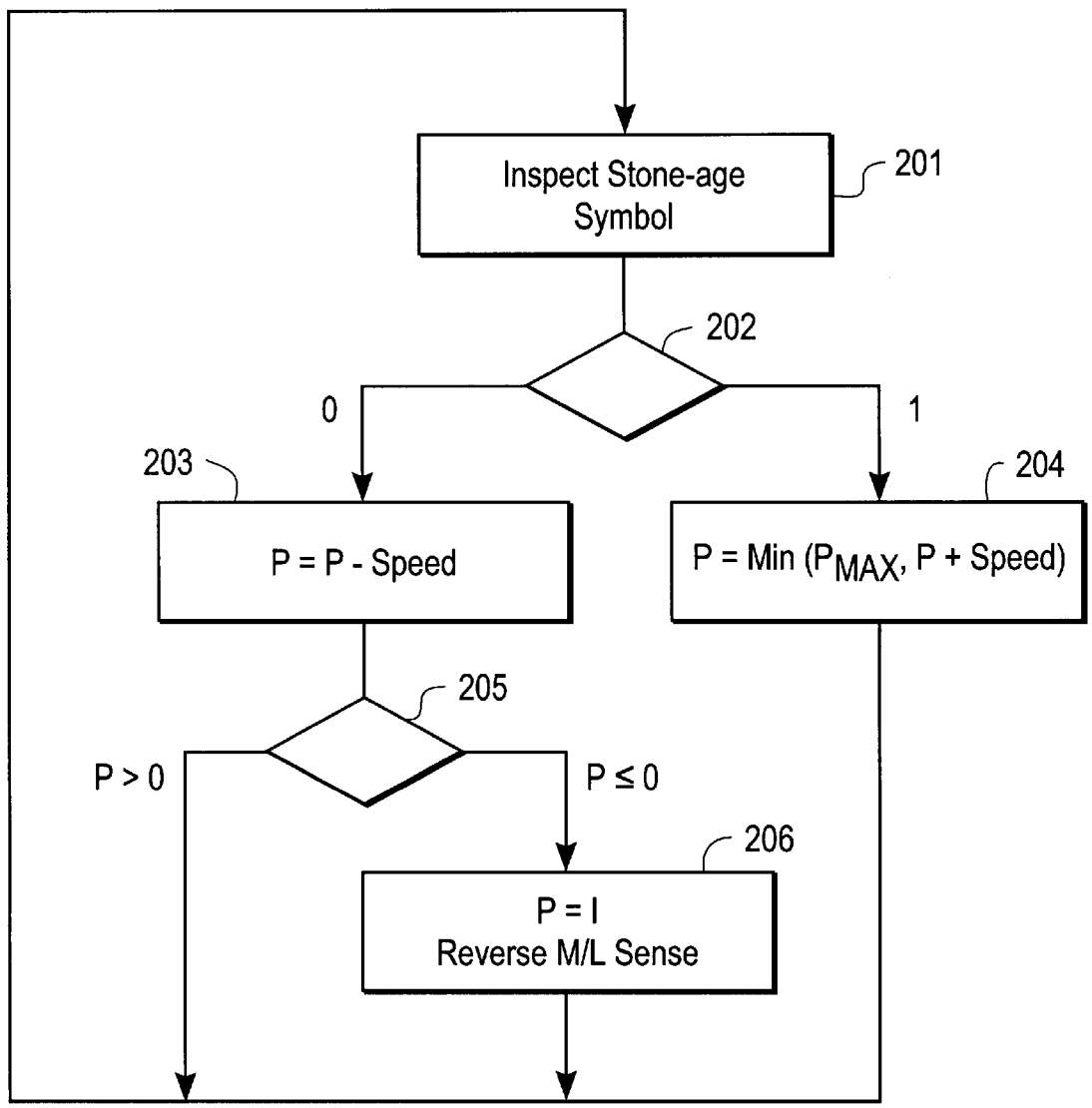
FIG. 2 is a flow diagram of one embodiment of a process for determining a position value.

FIG. 2 is a flow diagram of one embodiment of the adaptive coding process of the present invention using a table, such as shown in FIG. 1A. Referring to FIG. 2, the process begins with the processing logic inspecting the stone-age symbol that is associated with each output of the coder (processing block 201). Next, processing logic tests whether the stone-age symbol is a 1 or a 0 (processing block 202). In one embodiment, if processing logic determines that the stone-age symbol is a 0, then processing continues at processing block 202 where a new position value P (to select a position indicator associated with the table of codes) is assigned as the current position value less a speed value. Thereafter, processing logic compares the position value P to see if it is greater than or equal to zero (processing logic 205). If the position value P is less than or equal to zero, then processing transitions to processing block 206 where the position value is set equal to one, the designations of the most probable symbol and least probable symbol are reversed, and processing loops back to processing block 201. If the position value P is greater than zero, then processing loops back to processing block 201 as well.

On the other hand, if processing logic determines that the stone-age symbol is a 1, the position value P is set equal to the minimum of either the maximum P value (e.g., set to select the highest position indicator in the table) or the current position value plus the speed value (processing block 204). Thereafter, processing loops back to processing block 201.

Figure 3:
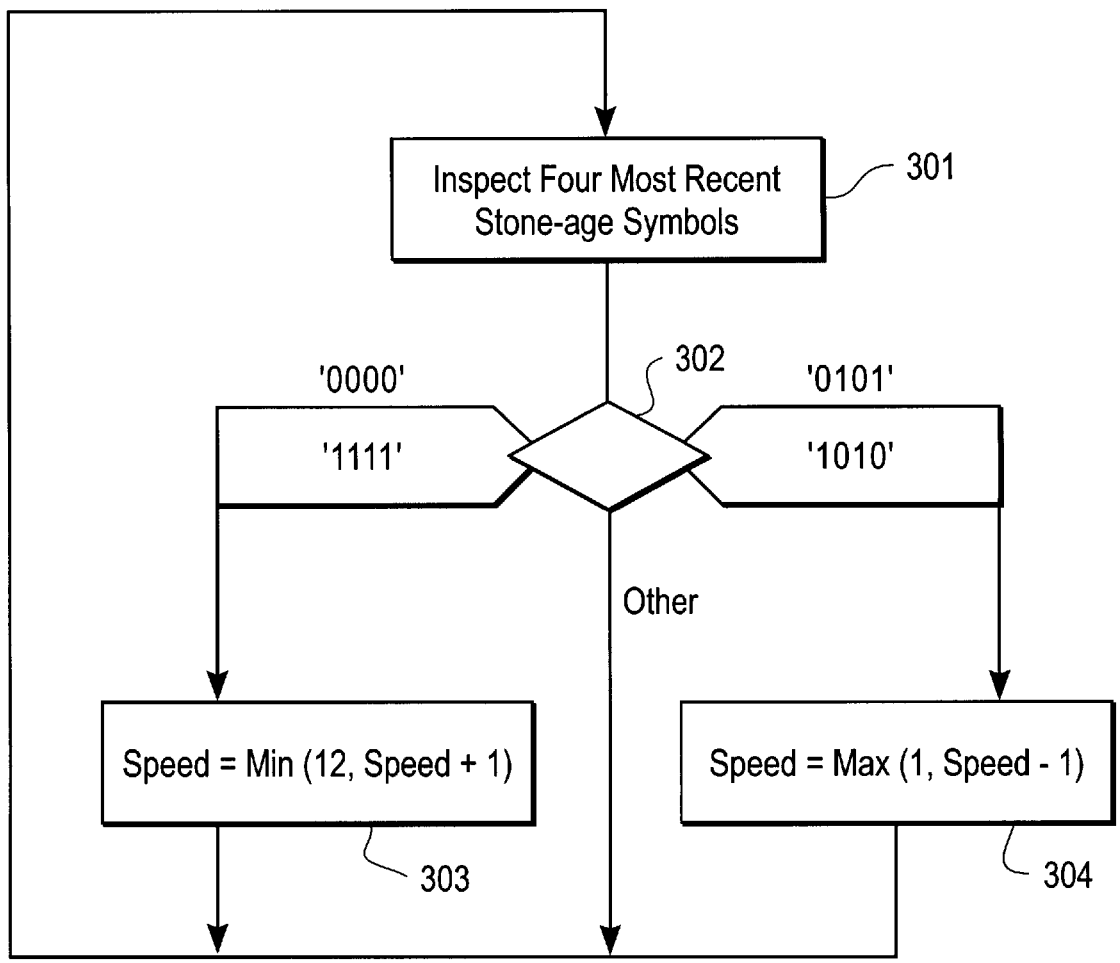
FIG. 3 is a flow diagram of one embodiment of a process for determining speed.

FIG. 3 illustrates a flow chart of one embodiment of the process for determining the speed value for use in adapting the speed, for example, in the process of FIG. 2. Referring to FIG. 3, processing logic begins by inspecting a predetermined number of the most recent stone-age symbols. In one embodiment, the number of stone-age symbols examined is four. Any number of stone-age symbols may be examined. The stone-age symbols may be bits from the four most recent outputs. In an alternative embodiment, only the stone-age symbols of the four most recent outputs associated with the same context as the current context or a group of contexts are used.

Next, processing logic comprises these four values against a predetermined set of values (processing block 302). Based on the comparison, the speed value may be either increased, decreased, or may remain the same.

In one embodiment, if the predetermined number of stone-age symbols comprises a pattern "0000" or "1111", processing continues to processing block 303 where the speed value is set equal to the lesser of either the maximum value or the current speed value plus one. Processing then continues at processing block 301.

If the predetermined number of stone-age symbols comprises alternating pattern of most probable and least probable symbols such as, for instance, "0101" or "1010" (or any similar number of alternating MSBs and LSBs), then processing continues to processing block 304 where the speed value is set to the maximum of either the lowest speed value or the current speed value minus 1. The output of processing block 304 is fed back to processing block 301.

Lastly, if the predetermined number of stone-age symbols is neither of the two cases above, then processing transitions to processing block 301, without changing the speed value.

Figure 4:
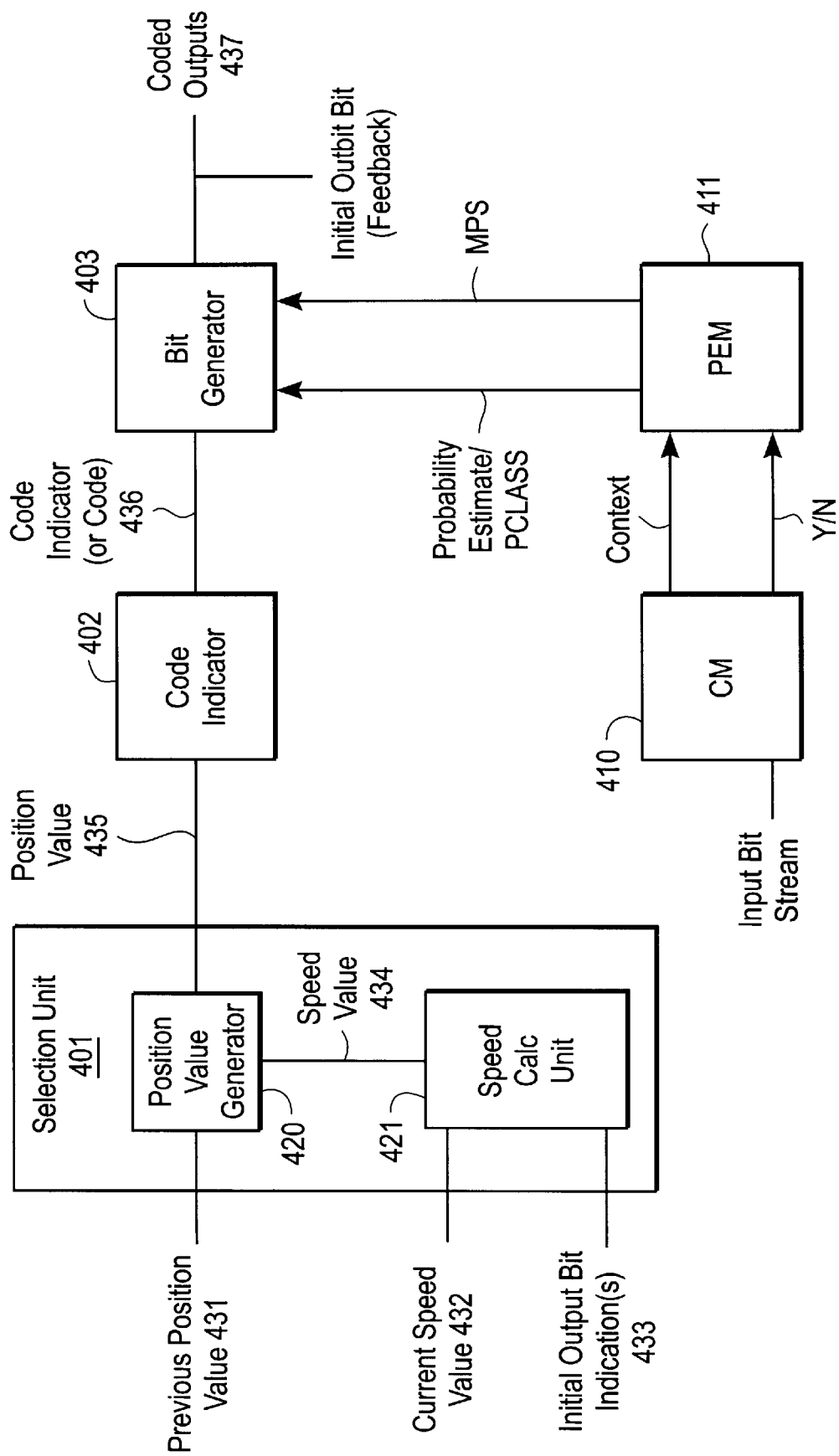
FIG. 4 is a block diagram of one embodiment of a coder.

FIG. 4 illustrates one embodiment of a coder. Referring to FIG. 4, coder 400 comprises selection unit 401, code indication 402, context model 410, probability estimation model (PEM) 411, and bit generator 403. Context model 410 and PEM 411 operate in a manner well-known in the art and will not be described in detail herein.

Selection unit 401 generates a position value 410 in response to the current speed value 420, an indication of the state of a number of initial output bits from a predetermined number of outputs, and a current position indication. In one embodiment, the indication may be the initial output bits themselves. In an alternate embodiment, the indication may comprise a value indicative of the pattern of initial output bits. In one embodiment, if all the initial output bits are the same value, then the input may be a −1. On the other hand, if the initial output bits alternate between least probable and most probable symbols, then the indication may comprise a 1. Otherwise, the indication may comprise a 0.

In one embodiment, the initial output bits are stored in a buffer memory for input to coder 400. These initial output bits may comprise the initial output bits of the most recent outputs. In an alternate embodiment, only those output bits associated with the same or group of contexts are input to the selection unit 401. In this case, a buffer or other storage area may store the initial output bit of each output by its contexts (or context group). A selection input representing the context (or group of context) could control selection of the indication or the actual initial output bits to be input to the selection unit 401.

Selection unit 401 comprises a speed calculation unit 421 coupled to receive the current speed 432 and the initial output bit indicator 433. In one embodiment, selection unit 401 may receive these inputs from registers. Alternatively, such a register may be external to selection unit 401 or selection unit 401 may comprise a register itself that stores the current speed value.

Based on these inputs, speed calculation unit 421 generates a speed value 434 which is input to a position value generator 420. Position value generator 420 generates position value 435 based on speed value 434 and the previous position value 431.

In one embodiment, previous position value 431 is stored in a register external to selection unit 401. Alternatively, previous position value 431 is stored in selection unit 401.

Position value 435 is input to a code indicator 402 which generates a code indicator indicating the code to be used by bit generator 403. Based on this indication, bit generator 403 uses the code to compress the incoming bit(s). In one embodiment, code indicator 402 comprises a table with a code indicator stored for each position indicator. The table may be designed so that each code indicator is associated with one or more listed position values. In an alternate embodiment, the table contains the code to be used by bit generator 402 and forwards the code to bit generator 403 in response to position value 435 being generated by selection unit 401.

In response to the code indicator (or code) 436, bit generator 403 generates outputs representing coded data. The initial output bits of each output are also fed back or stored for use in determining speed value 434 in the future.

During decoding, assuming the decoder operates using the same code (to reverse the encoding performed by the bit generator) and using the same adaptive process, the decoder should transition between different codes in the same manner as during encoding. Specifically, by monitoring patterns of the initial bit received for each codeword (received either from memory or a channel), the decoder can adapt the speed depending on the particular pattern that occurs.

A decoder operating in a similar manner to reverse the coding process could also include a selection unit to generate a position value using a speed calculation unit and a position value generator. The position value could then be used to indicate a code to be used to decode the coded input into a bit stream with bit generation (and a PEM and context model).

Figure 5:
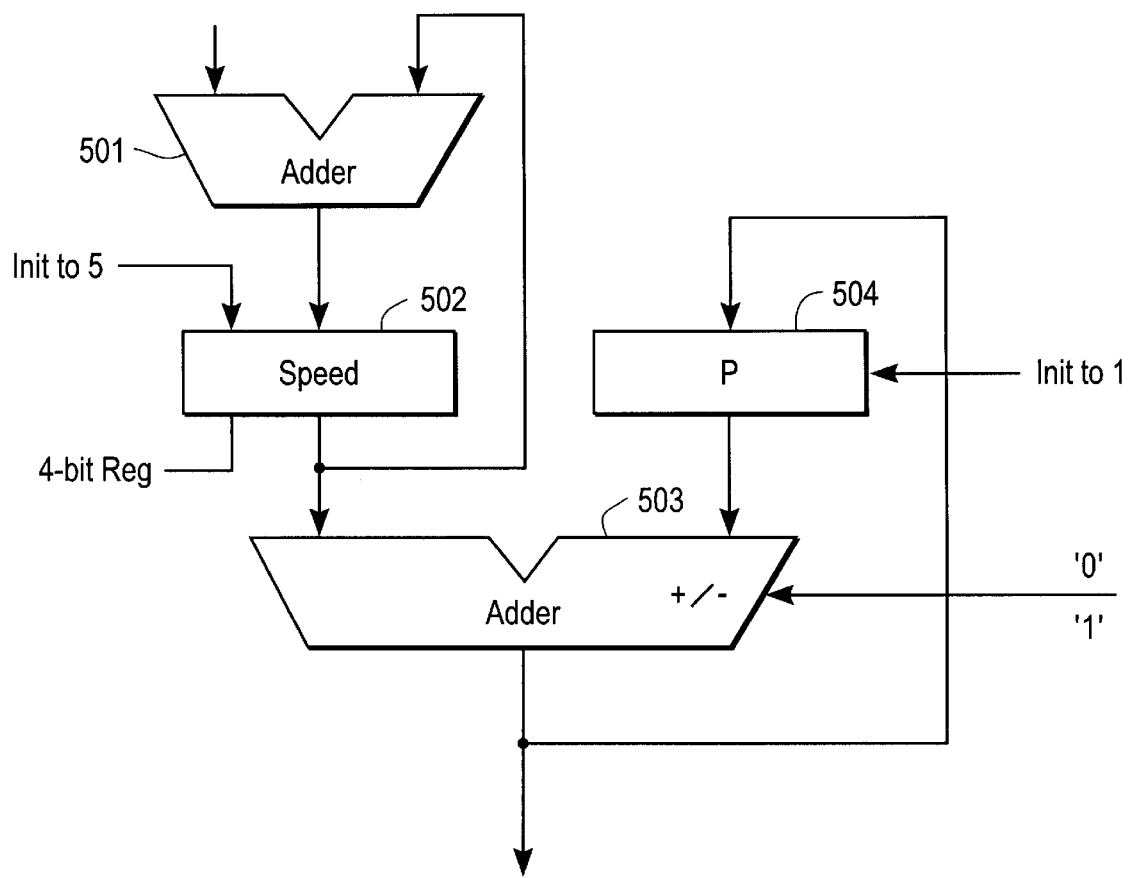
FIG. 5 illustrates one embodiment of a selection unit.

FIG. 5 is a diagram of one embodiment of the selection unit of the present invention. Referring to FIG. 5, an adder 501 is coupled to receive a value based on the pattern of the stone-age symbols from a predetermined number of the outputs. In one embodiment, the value comprises a +1 where the predetermined number of most recent stone-age symbols comprises an alternating pattern of most probable and least probable symbols (e.g., "0101", "1010", etc.). This input is a −1 when the predetermined number of most recent stone-age symbols comprises either all most probable symbols or all least probable symbols (e.g., "1111", "0000"). Otherwise, the input is a 0 for any other combination of most probable symbols and least probable symbols for the pattern of stone-age symbols from the predetermined number of outputs.

The other input to adder 501 comprises a current speed value which is stored in register 502. The output of adder 501 is coupled to the input to register 502 which stores the speed value. In one embodiment, register 502 is a 4-bit register, and the speed value in register 502 is initialized to a predetermined number, such as, for example, five, during reset. The initial speed value is not particularly important—the speed will be automatically tuned by the invention. The speed value in register 502 is fed back to one input of adder 501 and also fed to one input of adder 503.

Adder 503 is also coupled to receive the position value stored in register 504 on its other input. In one embodiment, register 504 is initialized to a value of 1. Adder 503 either adds or subtracts the speed value from the position value based on a select input 505. The select input 505 is set based on whether the speed is increasing or decreasing.

The output of adder 503 is fed back to the input of register 504 which stores the current position value and is also output to indicate the particular code to be used by the bit generator.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a compression and decompression technique has been described.

I claim:

1. A method of coding data comprising:
   monitoring an initial output bit of each of a plurality of outputs generated by a coder in response to at least a portion of the data; and
   retuning the speed at which the coder transitions between different codes, used by the coder to code inputs into outputs, in real time to one closer to optimal, including adjusting the speed based on the initial output bits of the plurality of outputs.

2. The method defined in claim 1 wherein adjusting the speed comprises reducing the speed when the initial outputs bits alternate between denoting a run of more probable symbols and a less probable symbol.

3. The method defined in claim 2 further comprising reversing designations of the more probable symbol and less probable symbol and selecting a predetermined one of the different codes when sufficient consecutive initial output bits denote a less probable symbol.

4. The method defined claim 1 wherein adjusting the speed comprises increasing the speed when all of the initial output bits denote runs of more probable symbols or all said bits denote less probable symbols.

5. The method defined in claim 1 wherein the plurality of outputs comprise outputs generated for all contexts.

6. The method defined in claim 1 wherein the plurality of outputs comprise outputs generated for a single context.

7. The method defined in claim 1 wherein the plurality of outputs comprise outputs generated for a group of contexts.

8. The method defined in claim 1 wherein the plurality of outputs comprises four outputs.

9. The method defined in claim 1 wherein the different codes comprise Golomb codes.

10. The method defined in claim 1 wherein the data comprises stationary data.

11. A coder to code input data, said coder comprising:
    a bit generator to code the input data;
    a table having a plurality of locations selectable by a position indicator, each location, when selected, indicating a code which the bit generator uses to code the input data; and
    a position indicator unit to generate the position indicator based on a previous position indicator and a speed value indicative of the speed at which the bit generator transitions between different codes to code the input data, the position indicator unit comprising a speed unit to generate the speed value in real time, based on initial output bits of a plurality of previously generated outputs, to retune the speed value to one closer to optimal.

12. The coder defined in claim 11 wherein the position indicator unit adjusts the speed value by reducing the speed value when the initial outputs bits alternate between a run of more probable symbols and a less probable symbol.

13. The coder defined in claim 12 wherein the position indicator unit reverses designations of the more probable symbol and less probable symbol and selects a predetermined one of the different codes when sufficient consecutive initial output bits denote a less probable symbol.

14. The coder defined in claim 11 wherein the step of adjusting the speed comprises increasing the speed when all of the initial output bits comprise either more probable symbols or less probable symbols.

15. The coder defined in claim 11 wherein the plurality of outputs comprise outputs generated for all contexts.

16. The coder defined in claim 11 wherein the plurality of outputs comprise outputs generated for a single context.

17. The coder defined in claim 11 wherein the plurality of outputs comprise outputs generated for a group of contexts.

18. An apparatus for coding data comprising:
   means for monitoring an initial output bit of each of a plurality of outputs generated by a coder in response to at least a portion of the data; and
   means for retuning the speed at which the coder transitions between different codes, used by the coder to code inputs into outputs, in real time to one closer to optimal, including means for adjusting the speed based on the initial output bits of the plurality of outputs.

19. The apparatus defined in claim 18 wherein the means for adjusting the speed comprises reducing the speed when the initial outputs bits alternate between denoting a more probable symbol and a less probable symbol.

20. The apparatus defined in claim 19 further comprising means for reversing designations of the more probable symbol and less probable symbol and means for selecting a predetermined one of the different codes when sufficient consecutive initial output bits denote a less probable symbol.

21. The apparatus defined claim 18 wherein the means for adjusting the speed comprises increasing the speed when all of the initial output bits comprise either more probable symbols or less probable symbols.

22. A product having a recordable medium storing a plurality of instructions, which when executed, cause a processing device to:
   monitor an initial output bit of each of a plurality of outputs generated by a coder in response to at least a portion of the data; and
   retune the speed at which the coder transitions between different codes, used by the coder to code inputs into outputs, in real time to one closer to optimal, including adjusting the speed based on the initial output bits of the plurality of outputs.

23. The product defined in claim 22 wherein the plurality of instructions include at least one instruction which, when executed, causes the processing device to reduce the speed when the initial outputs bits alternate between denoting a run of more probable symbols and a less probable symbol.

24. The product defined in claim 22 wherein the plurality of instructions include at least one instruction which, when executed, causes the processing device to:
   reverse designations of the more probable symbol and less probable symbol; and
   select a predetermined one of the different codes when sufficient consecutive initial output bits denote a less probable symbol.

25. The product defined in claim 22 wherein the plurality of instructions include at least one instruction which, when executed, causes the processing device to increase the speed when all of the initial output bits denote runs of more probable symbols or all said bits denote less probable symbols.

* * * * *